(12) United States Patent
Faber

(10) Patent No.: US 12,483,242 B2
(45) Date of Patent: Nov. 25, 2025

(54) COIL SYSTEM FOR AN INDUCTIVE PROXIMITY SWITCH FOR FLUSH OR NON-FLUSH INSTALLATION IN A HOUSING

(71) Applicant: Turck Holding GmbH, Halver (DE)

(72) Inventor: Michael Faber, Altena (DE)

(73) Assignee: Turck Holding GmbH, Halver (DE)

( * ) Notice: Subject to any disclaimer, the term of this patent is extended or adjusted under 35 U.S.C. 154(b) by 0 days.

(21) Appl. No.: 18/782,074

(22) Filed: Jul. 24, 2024

(65) Prior Publication Data

US 2025/0038746 A1    Jan. 30, 2025

(30) Foreign Application Priority Data

Jul. 28, 2023  (DE) .............. 10 2023 120 087.9

(51) Int. Cl.
*H03K 17/95* (2006.01)
*H05K 1/16* (2006.01)

(52) U.S. Cl.
CPC ....... *H03K 17/952* (2013.01); *H03K 17/9505* (2013.01); *H05K 1/165* (2013.01); *H05K 2201/09272* (2013.01)

(58) Field of Classification Search
CPC .. H03K 17/9505; H03K 17/95; H03K 17/952; H03K 2017/9527; H05K 1/165; H05K 2201/10151; H05K 2201/09272; H01F 2027/2809; H01F 27/2804
See application file for complete search history.

(56) References Cited

U.S. PATENT DOCUMENTS

| | | | |
|---|---|---|---|
| 2008/0204118 A1* | 8/2008 | Kuhn | H03K 17/9505 327/517 |
| 2012/0206132 A1 | 8/2012 | Lepage | |
| 2017/0302273 A1* | 10/2017 | Kántor | H01F 27/366 |

FOREIGN PATENT DOCUMENTS

| | | |
|---|---|---|
| DE | 10 2006 011 483 A1 | 9/2006 |
| DE | 20 2006 003 990 U1 | 9/2006 |
| EP | 3 688 971 A1 | 4/2019 |
| EP | 3 594 724 A1 | 1/2020 |
| WO | 2019/063679 A1 | 4/2019 |

OTHER PUBLICATIONS

Extended European Search Report issued in EP 24 190 771.6, which is a counterpart hereof, mailed Nov. 22, 2024 and English language machine translation thereof.
Search Report issued in DE 10 2023 120 087.9, to which this application claims priority, mailed May 15, 2024 (English language machine translation attached).

* cited by examiner

*Primary Examiner* — Ryan Johnson
(74) *Attorney, Agent, or Firm* — Tautz & Schuhmacher LLC; Michael McCandlish

(57) ABSTRACT

A coil system for an inductive proximity switch for flush or non-flush installation in a housing includes a coil board. At least one first receiver coil and one transmitter coil are arranged on the coil board, wherein the first receiver coil includes a coil designed in a polygonal form. A method for producing a coil system for an inductive proximity switch includes forming at least one first receiver coil on a coil board in a layered arrangement and forming a transmitter coil on the first receiver coil in a layered arrangement. The first receiver coil includes a coil with a polygonal form.

17 Claims, 3 Drawing Sheets

COIL SYSTEM FOR AN INDUCTIVE PROXIMITY SWITCH FOR FLUSH OR NON-FLUSH INSTALLATION IN A HOUSING

CROSS REFERENCE TO RELATED APPLICATIONS

This application claims priority to German patent application 10 2023 120 087.9 filed on Jul. 28, 2023, which is hereby incorporated by reference in its entirety.

TECHNICAL FIELD

The present disclosure relates to a coil system for an inductive proximity switch for flush or non-flush installation in a housing. Furthermore, the disclosure relates to an inductive proximity switch having the coil system and to a method for producing the coil system.

BACKGROUND

Inductive sensors having wound coils, which are used for the alignment of the electromagnetic field in a ferrite core, are known in the prior art.

The construction of sensors which are to be inserted into a housing in a flush manner and are then surrounded by the housing in the circumferential direction presents particular challenges. In particular, metallic housings have a shielding effect which can impair the function of the receiver coils. Therefore, for flush installation, special sensor variants are normally devised in which the receiver coils are at a certain distance from the surrounding housing. However, this means that the receiver coils in sensors for flush installation have a smaller diameter than those in variants for non-flush installation and accordingly have poorer detection properties.

The diameter of the ferrite cores for flush and non-flush sensors may differ greatly due to the spacing that the coils in flush devices require for internal shielding. This correlation may likewise apply for wound 3-chamber coils of factor 1 sensors.

In factor 1 sensors having printed coils, the diameters of the printed coils of flush sensor variants may likewise be smaller than the coil diameters of non-flush sensor variants or they are restricted by compensating windings for installation in metal, This may mean that the large sensing distances customary in non-flush variants cannot be achieved. Therefore, these sensors likewise have different coil boards for non-flush and flush sensors.

Various configurations of inductive sensors are proposed in the prior art. Inductive proximity sensors having a transmitter and receiver coil detect a damping of the resonant circuit when approaching a metallic object (having the corresponding magnetic properties) and switching takes place when a sensing distance is reached.

In EP 3 688 971 A1, an inductive proximity switch is proposed, which comprises a transmitter coil, a receiver coil, an integrated circuit for excitation of the transmitter coil and a signal processing unit for processing a signal received by the receiver coil, wherein an oscillator excites a resonant circuit, which comprises the transmitter coil and a parallel capacitor for inducing a voltage in the receiver coil. The receiver coil in this inductivity proximity switch comprises two symmetrical segments with opposite alignment, connected in series, wherein the transmitter coil surrounds the segments of the receiver coil or the transmitter coil is surrounded by the segments of the receiver coil.

Common to the known solutions is that they often have a geometry which does not enable the use of both non-flush and flush sensors with the required standard sensing distances. Therefore, different variants of a sensor board have to be provided for different installation situations.

One possible object of the present disclosure can consist in specifying a coil system for an inductive proximity switch, an inductive proximity switch and a method for producing a coil system, which are each suitable for at least partially overcoming the above-mentioned disadvantages of the prior art and for enhancing the prior art.

SUMMARY

A coil system for an inductive proximity switch for flush or non-flush installation in a housing is provided. The housing may, optionally, be in the form of a metallic housing or it may at least comprise metal. The coil system comprises a coil board on which at least one first receiver coil and one transmitter coil are arranged. Here, the first receiver coil comprises a coil designed in a polygonal form.

The receiver coil and the transmitter coil may, optionally, be in the form of a printed coil. They may furthermore be arranged one above the other in a layered manner.

Within the context of the present disclosure, a sensor which can be installed in a flush or completely flush manner can be a sensor which is incorporated completely in the surrounding material of the housing, optionally a metal, up to its top sensor face.

In the case of non-flush installation of a sensor, on the other hand, a clearance can be provided around the active face. Provision can be generally made for a sensor installed in a non-flush manner to protrude somewhat out of the housing, optionally such that the coils are not surrounded by metallic material.

The housing can be an element having a surface in which the sensor may be mounted and the non-flush sensor protrudes out of the surface. The non-flush sensor can therefore be sunk less than completely in the metal, which means that the metal optionally does not have a shielding effect.

The coil system, described here, for an inductive proximity switch therefore can offer a range of advantages. Amongst other things, a coil system may be formed of a transmitter and a receiver coil (alternatively with further receiver coils) on a front coil board, wherein large sensing distances are maintained in the case of non-flush installation and a large sensing distance is enabled even in the case of a flush installation of these sensors.

Moreover, a simple design can be achieved and cost-effective and automated production of the sensors can therefore be enabled.

Moreover, the design can result in good temperature stability and long-term stability of the sensors.

Moreover, the influence of external magnetic fields on the switching behavior may be minimized.

Furthermore, a single coil variant or coil board may be provided for each sensor design for device variants with both flush and non-flush installation. Identical sensor or electronic assemblies may therefore be used for the housing variants.

Furthermore, assemblies, modules and platforms may be combined, whereby advantages in terms of the logistics and in terms of the material costs or production costs of the sensors can be realized.

Optional developments of the above-described method are explained in detail below.

Provision may be made for the polygonal form of the first receiver coil to be designed such that its corner points are arranged at least partially in an edge region of the coil board. The width of the edge region may be, for example, up to two tenths, preferably up to one tenth of a width of the coil board. Thus, the largest possible coil diameter of the receiver coil may be obtained at the corners of the polygon, so that a greater sensing distance may be achieved.

The side lengths of the polygon can, in this case, be further away from the edge of the coil board—and therefore also from a surrounding housing—than the corners. Any shielding or influence on a measurement signal by a surrounding housing can therefore be minimized in these regions of the coil.

Provision may be made for the first receiver coil to have a convex polygonal form, optionally a regular convex polygonal form. In this context, "convex" means that all internal angles are smaller than 180°. "Regular" here means that the polygon is equiangular. Alternatively, at least one angle may be greater than 180°, which means that the polygon may be at least partially concave, for example in the case of a star form.

The polygonal form may optionally have four side lengths and four internal angles, which are distributed optionally symmetrically and uniformly with respect to one another. The first receiver coil optionally can have a rhomboidal form, optionally a square form.

The geometry of the receiver coil may be realized, for example, in the form of a rhomboid or a square so that the coil diameter is maximal at just the four corner points but a greater distance from the surrounding metal of the housing—be this an internal metallic shielding or a metallic mounting face for the sensor—may be achieved at the side faces. Therefore, there can be substantially no influence on the differential voltage to be evaluated.

A single coil board may therefore be used to enable the evaluation and the detectable sensing distance with this special coil geometry for flush and non-flush sensor variants.

Provision may be made for the transmitter coil to have a circular form, wherein the transmitter coil optionally has the maximum diameter that can be formed on the coil board. This can mean that the diameter of the transmitter coil is designed to be as large as possible, optionally to reach to the edge or into the edge region of the coil board. Therefore, it can be possible to achieve the propagation of the electromagnetic field of the transmitter coil with the greatest possible range.

Provision may be made for at least one second receiver coil to be furthermore provided. The first receiver coil and the second receiver coil may be arranged one above the other on the coil board, in a layered manner, wherein the first and the second receiver coil in the layered arrangement are each formed with up to 3 layers. The transmitter coil can be arranged between the first and the second receiver coil and the transmitter coil can be formed with a multiplicity of layers, optionally in a range of 1 to 5 layers. Furthermore, a range of 3 to 5 layers may be provided.

The first and the second receiver coil may each comprise a printed coil or be in the form of a printed coil.

Provision may be made for the first receiver coil and the second receiver coil to have opposite winding directions.

In one example, provision may be made to use up to 3 layers with the same winding direction, i.e. the same direction in terms of the current flow, for the first receiver coil. Subsequently, up to 5 layers are provided for the transmitter coil, all with the same winding direction. Then, up to 3 layers can be provided for the second receiver coil, with an opposite winding direction to the first receiver coil. In addition, one layer can be provided for a shield grid against HF interference, one layer can be provided for the corresponding connecting traces and a further layer can be provided for corresponding connection paths to an electronic board.

Provision may furthermore be made for the stack of the coil board to have a total of 8 to 16 layers, optionally 8 to 14 layers, preferably 14 layers. The number of layers, for example 14 copper layers, may be configured so that the coil board is designed to be less complex and intricate, while still having available space for the layouts of the copper layers for the receiver and transmitter coils. Moreover, the complexity and the effort involved in the manufacture, as well as the costs, can be highly dependent on the number of layers and the purchase price can therefore increase when the number of layers is higher. It can therefore be advantageous if the coil boards have a less complex design and may moreover be used for non-flush and flush installation situations.

The inductive proximity switch can comprise a coil system according to the present description and a housing. The coil system can be arranged in or on the housing in a flush or non-flush manner.

The housing can have a housing cross-sectional area. Optionally, the housing cross-sectional area is defined along a plane which is spanned by the coil board in the installed state.

The housing may be made at least partially from metal. In the installed state, the coil system may furthermore be at least partially surrounded by metal in the circumferential direction.

The housing cross-sectional area may have a circular design, for example. Furthermore, by way of example, the receiver coil may have a square form, wherein the corners of the square reach substantially to the edge, i.e. close to the housing.

In another example, the housing cross-sectional area may also have a square design. A square housing cross-sectional area may be particularly suitable for receiving the square or rhomboidal form of the receiver coil.

Alternatively, an elongated oval or rectangular housing cross-sectional area may also be provided, which are suitable for receiving a receiver coil with a rhomboidal form, for example.

Provision may be made for the receiver coils to be arranged such that they are rotated through 45° with respect to a square housing cross-sectional area of the housing. The receiver coil may have an elongated rhomboidal or square design, so that it has a large diameter (at the corners) on the one hand and is far away from the surrounding metallic housing on the other. This can be particularly pronounced if the, optionally square shaped, receiver coil is oriented such that it is rotated through 45° with respect to the square housing cross-sectional area. The corners of the square of the coil can therefore be arranged close to the square housing, whilst a greater distance from the corners of the square housing cross section is obtained at the sides of the square of the coil.

The description above can be summarized using other words to give a possible, more specific configuration of the disclosure as described below, wherein the description below should not be interpreted as restrictive for the disclosure. The geometry of the coils may be adapted to the requirements so that both non-flush and flush sensors with the necessary and customary standard sensing distances may be realized by one coil design.

To achieve such a behavior, a transmitter coil on the coil board has, optionally, been given the maximum possible diameter so as to ensure the propagation of the electromagnetic field with the greatest possible range.

The geometry of the receiver coils may be realized in the form of a rhomboid or a square so that the coil diameter is maximal at just the four corner points but a greater distance from the surrounding metal is—be this an internal metallic shielding or a metallic mounting face for the sensor—is established at the side faces so that there is no substantial influence on the differential voltage to be evaluated.

The evaluation and the detectable sensing distance may therefore be enabled with this special coil geometry and only one coil board for flush and non-flush sensor variants.

This coil system can be adjusted and used in the respective installation situation without further prior adaptation. By way of example, two variants in terms of the geometry of the installation may be provided, namely a circular or an angular installation.

In the case of cylindrical sensors, a front cap can typically project out of the housing, i.e., the sensor can be installed in a non-flush manner; however, an adjustment to a flush sensing distance can still be possible.

Two receiver coils may be provided, namely a receiver coil in front of the transmitter coil and a receiver coil behind the transmitter coil—the transmitter coil can then be arranged between a first and a second receiver coil, wherein the coils are arranged one above the other in a coil stack. The receiver coils may have 3 layers, for instance, and may have between 1.4 to 5 windings in each layer, for example. The transmitter coil may have up to 5 layers, optionally in a range of 3 to 5 layers.

The transmitter coil may have a circular design. By way of example, between 4.0 and 5.0 windings are provided in each layer of the transmitter coil. Provision may be made for the windings of the circular transmitter coil to have the widest possible design in order to be as low impedance as possible. The traces can therefore be nearer to one another.

The stack of coils as a whole can be limited due to the extent in height; for example, approximately 1.5 mm, of which 12 layers are with coils.

Moreover, a method for producing a coil system for an inductive proximity switch is provided. The method comprises a plurality of method steps. In a first method step, at least one first receiver coil is formed on a coil board in a layered arrangement, and in a further method step, a transmitter coil is formed on the first receiver coil in a layered arrangement. The transmitter coil here comprises, optionally, at least one coil with a circular form. The first receiver coil comprises a coil with a polygonal form, optionally with four side lengths and internal angles, which are distributed optionally symmetrically and uniformly with respect to one another.

The method is, optionally, suitable for producing the coil system described here. It therefore has the corresponding advantages and may be developed in a similar manner to the coil system.

The above configurations and developments can be combined with one another in any manner, provided that this is reasonable. Further possible configurations, developments and implementations of the disclosure also comprise combinations of features of the disclosure not explicitly mentioned, which have been previously described or which are described below with respect to the developments. Optionally, a person skilled in the art will also add individual aspects as improvements or additions to the respective basic form of the present disclosure. Optionally, features of the device claims may be realized and/or implemented by corresponding functions that complement or expand the method. Furthermore, method steps may be realized in the device by corresponding implementation modules. Therefore, the above statements relating to the device also apply analogously to the method, and vice versa.

BRIEF DESCRIPTION OF THE DRAWINGS

Further details and advantages of the disclosure shall now be explained in more detail with reference to the exemplary embodiments illustrated in the drawings, in which.

DESCRIPTION

Figure 1B:
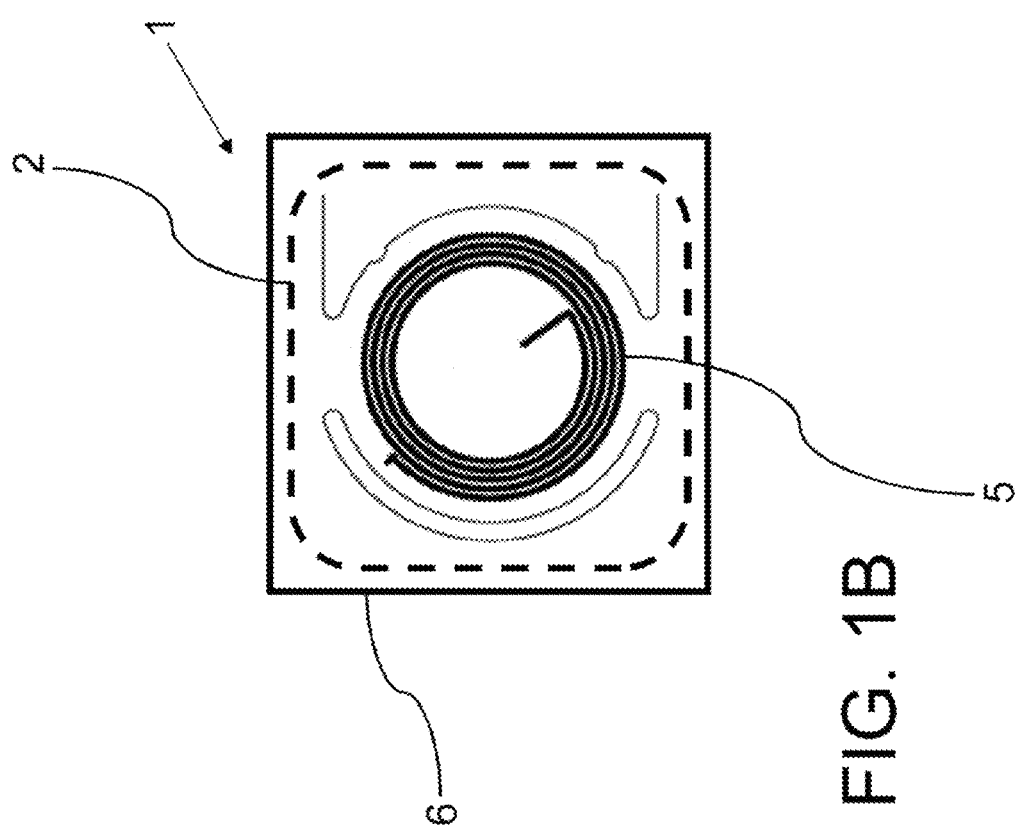
FIG. 1A to 1D show schematic illustrations of individual layers of a coil system according to the disclosure in an inductive proximity switch.
Figure 1A:
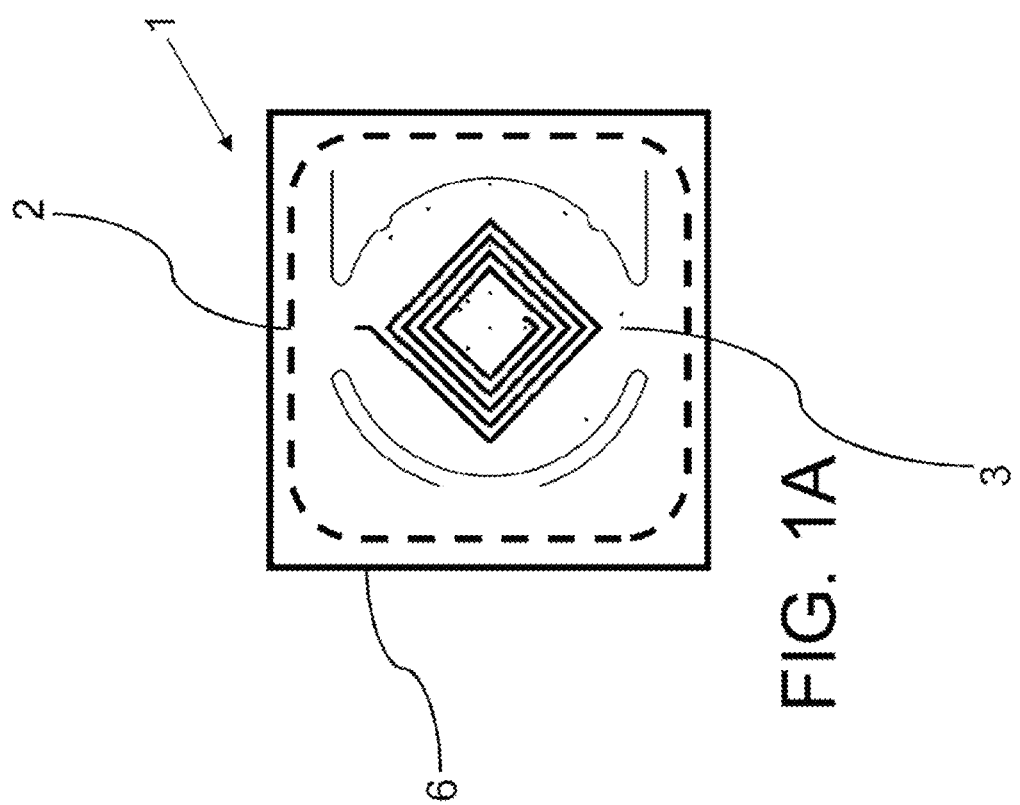
Figure 1D:
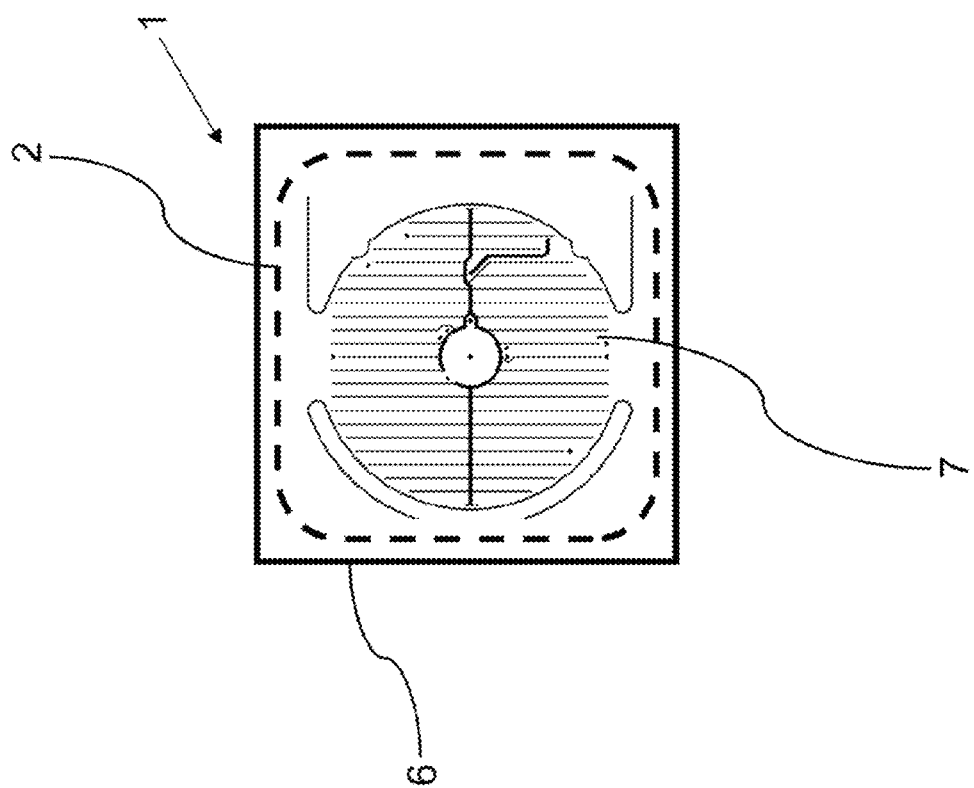
Figure 1C:
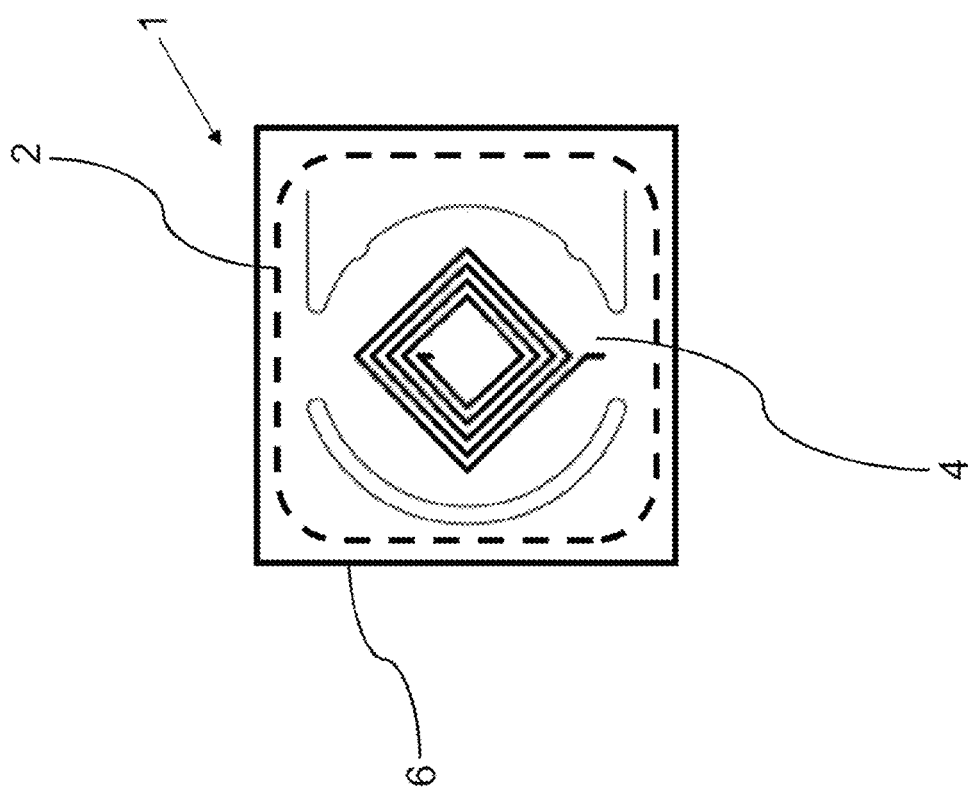

The drawings and the following explanation or description thereof is not intended to limit the disclosure.

The accompanying drawings are intended to provide a greater understanding of the development of the disclosure. They show developments and, in conjunction with the description, serve to explain principles and concepts of the disclosure. Other developments and many of the said advantages are revealed with respect to the drawings. The elements of the drawing are not necessarily drawn to scale with one another.

In the FIGS., similar, functionally similar and similarly acting elements, features and components are each denoted by the same reference symbols-unless stated otherwise.

A first example of the inductive proximity switch 1 is explained with reference to FIG. 1A to 1D. Individual layers of a coil stack are shown merely by way of example and schematically.

The inductive proximity switch 1 is provided for flush or non-flush installation in a housing 6. The housing 6 here may be metallic or it may comprise a metallic material.

In the case of a flush or non-flush installation of the inductive proximity switch (sensor), the maximum sensing distances achieved may differ. In the example, the maximum sensing distance of a non-flush inductive proximity switch corresponds approximately to the coil diameter or housing diameter. The maximum sensing distance of a flush inductive proximity switch corresponds approximately to half the coil/housing diameter.

On the one hand, a special characteristic of the coil design of the proximity switch 1 is that it can be adjusted to match the greater sensing distance for the inductive proximity switch installed in a non-flush manner, with the feature that the sensor assembly may be used in or on a metal surrounding area where otherwise only flush proximity switches may be used and the proximity switch continues to function with its guaranteed properties.

If the proximity switch 1 is inserted into a metallic sensor housing, for example for flush cylindrical sensor variants, then this sensor assembly can be adjusted to the required sensing distance without additional work or measures.

The inductive proximity switch 1, which is shown schematically in a plan view of a cross section of the housing 6, comprises a coil board 2.

The coil board 2 is designed to receive at least one first receiver coil 3.

The first receiver coil 3 in the example has a square form, wherein it is arranged such that it is rotated through 45° with respect to the likewise square housing cross section. It has a maximum coil diameter at the four corner points, which means that the corner points extend up to the edge of a printable region of the coil board 2. It furthermore forms a greater distance from the surrounding housing 6 at the four side lengths of the square, so that an influence on the detected measurement signal by the surrounding housing 6 (in the case of flush installation) is minimized.

The receiver coil 3 may be printed onto the coil board 2.

The first receiver coil 3 may have a square form or the form of a rhomboid or it may, optionally, have a convex polygonal form. The first receiver coil 3 comprises a coil designed in a polygonal form, optionally with four side lengths and internal angles, which are distributed optionally symmetrically and uniformly with respect to one another.

A polygonal form here may also be understood in general to mean that the form has corners at which the coil is arranged near to the surrounding housing 6, and edges at which a greater distance from the housing 6 is obtained so that the housing 6 has less influence on the measurement signal there.

In the example, a second receiver coil 4 is furthermore provided, which is formed substantially analogously to the first receiver coil 3.

Furthermore, the coil system of the inductive proximity switch 1 comprises a transmitter coil 5 which, in the example, is arranged between the first 3 and second receiver coil 4.

The transmitter coil 5 comprises a coil having, optionally, a circular form.

Moreover, the transmitter coil 5 has the maximum diameter that can be formed on the coil board 2, which means that it has the greatest diameter possible within the printable region of the coil board 2.

In the example, provision is furthermore made for a coil layer 7 to be provided with a grid 7, which shields the coil stack against electromagnetic interference in one direction or which shields the field generated by the transmitter coil in one direction.

The coil forms and examples shown in FIG. 1A to 1D are merely examples, and do not represent a restrictive configuration of the coil system of the inductive proximity switch 1.

Optionally, provision is made for the grid 7, the first receiver coil 3, the transmitter coil 5 and the second receiver coil 4 to be arranged on the coil board 2 in a stacked manner.

In the example, the first receiver coil 3 and the second receiver coil 4 are arranged in a layered arrangement.

The receiver coils 3, 4 may each be formed with 3 layers, for example.

The first receiver coil 3 and/or the second receiver coil 4 may have a square form or the form of a rhomboid; however, other forms of at least one of the receiver coils 3, 4 may also be provided.

The transmitter coil 5 may be arranged between the first receiver coil 3 and the second receiver coil 4.

The transmitter coil 5 may be formed with a range of 3 to 5 layers.

In the example, the coil board 2 in the embodiment of the inductive proximity switch 1 with a first and a second receiver coil 3, 4 may have 14 layers.

The first receiver coil 3 and the second receiver coil 4 have, optionally, opposite winding directions.

In the example, the inductive proximity switch 1 has a housing 6.

In the example shown in FIG. 1A to 1D, the housing 6 has a square housing cross-sectional area. In the square housing cross-sectional area, the first and the second receiver coil 3, 4 may be provided in a square form, circular form or rhomboidal form.

Figure 2:
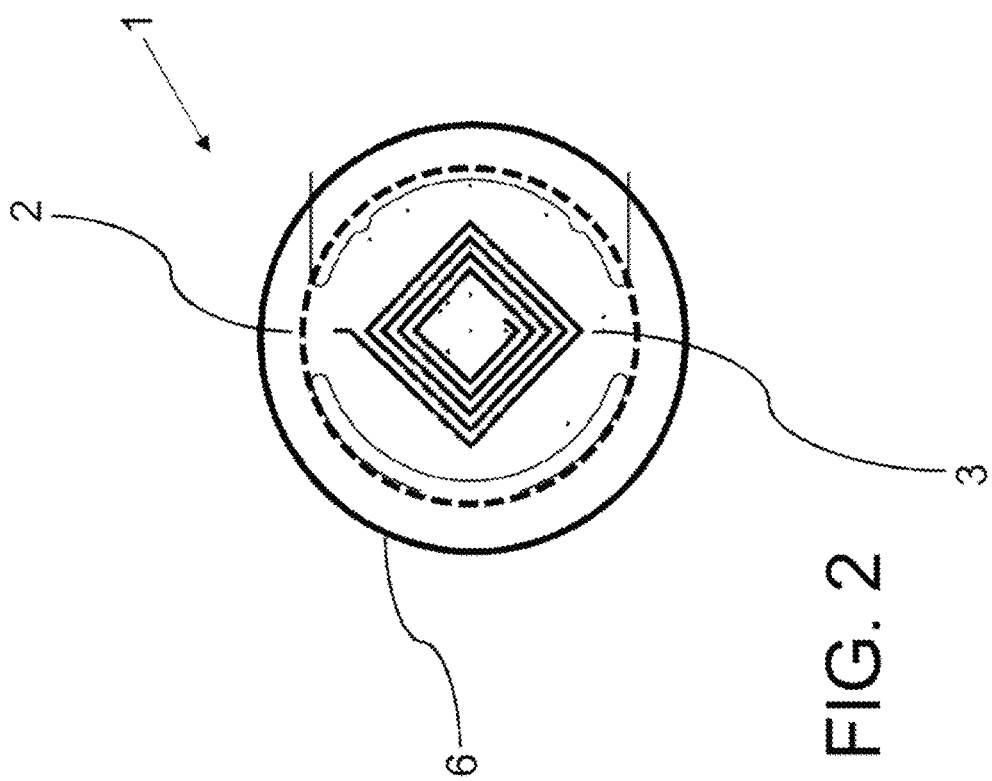
FIG. 2 shows a schematic illustration of a layer in a further inductive proximity switch.

In an alternative configuration of the inductive proximity switch 1, shown in FIG. 2, the housing 6 has a circular cross section. The coil board 2 also has a circular design here. By way of example, only one layer of a first receiver coil 3, which is designed in a square form, is shown here.

The corners lie at the edge of a printable region of the coil board 2, while the sides of the square are at a greater distance from the housing 6.

In this example, a first receiver coil 3 and second receiver coil 4 are formed analogously to the case shown in FIG. 2. A transmitter coil 5 is arranged between the first receiver coil 3 and second receiver coil 4.

In this example, the proximity switch 1 is otherwise formed analogously to the example explained above.

In further examples, the housing 6 may have an elongated, oval or rectangular design. Optionally, in such alternative configurations, a rhomboidal form of the first receiver coil 3 and second receiver coil 4 is advantageous.

Figure 3:
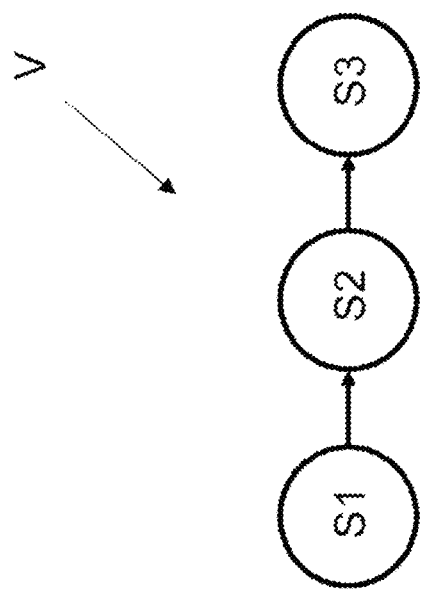
FIG. 3 shows a flow chart of a method according to the disclosure.

FIG. 3 shows a flow chart of a method according to the disclosure. The above-described exemplary embodiments of the coil system or the inductive proximity sensor are taken as the starting point.

In FIG. 3, the reference symbol V denotes an embodiment of the method.

The method V for producing a coil system for an inductive proximity switch 1 has a plurality of method steps.

In a first method step S1, at least one first receiver coil 3 is formed on a coil board 2 of the inductive proximity switch 1 in a layered arrangement, optionally by printing the traces of the coils.

In a further method step S2, a transmitter coil 5 is formed on the first receiver coil 3 in a layered design. The transmitter coil 5 comprises a coil which has, optionally, a circular form.

The first receiver coil 3 comprises a coil designed in a polygonal form, optionally with four side lengths and internal angles, which are distributed optionally symmetrically and uniformly with respect to one another.

Furthermore, a further method step S3 is provided, in which a second receiver coil 4, which is designed analogously to the first receiver coil 3, is formed on the transmitter coil 5 in a layered design.

In the example, the first receiver coil 3, the second receiver coil 4 and the transmitter coil 5 are stacked one above another.

Moreover, further layers for a shield grid, connecting traces and a layer with connection pads for an electronic board are provided.

With the arrangement of the coils, both non-flush and flush proximity switches with the necessary and customary standard sensing distances may be realized.

REFERENCE SYMBOLS

1 Inductive proximity switch
2 Coil board
3 First receiver coil
4 Second receiver coil
5 Transmitter coil
6 Housing
7 Grid
V Method
S1, S2, S3 Method steps

What is claimed is:

1. An inductive proximity switch comprising:
    a housing; and
    a coil system,
    wherein the coil system includes a coil board on which at least one first receiver coil and one transmitter coil are arranged;
    wherein the first receiver coil includes a coil with a polygonal form;
    wherein the coil system is arranged in the housing in a flush or non-flush manner;
    wherein the housing has a square housing cross-sectional area suitable for receiving the coil system; and
    wherein the first receiver coil is arranged such that it is rotated through 45° with respect to the square housing cross-sectional area.

2. The inductive proximity switch according to claim 1, wherein the polygonal form of the first receiver coil is designed such that its corner points are arranged at least partially in an edge region of the coil board.

3. The inductive proximity switch according to claim 1, wherein the first receiver coil has a convex polygonal form.

4. The inductive proximity switch according to claim 1, wherein the first receiver coil has a rhomboidal form.

5. The inductive proximity switch according to claim 1, wherein the first receiver coil has a square form.

6. The inductive proximity switch according to claim 1, wherein the first receiver coil has a regular convex polygonal form.

7. The inductive proximity switch according to claim 6, wherein the regular convex polygonal form has four side lengths and four internal angles, which are distributed symmetrically and uniformly with respect to one another.

8. The inductive proximity switch according to claim 1, wherein the transmitter coil has a circular form.

9. The inductive proximity switch according to claim 8, wherein the transmitter coil has a maximum diameter that can be formed on the coil board.

10. The inductive proximity switch according to claim 1, further comprising:
    at least one second receiver coil;
    wherein the first receiver coil and the second receiver coil are arranged one above another on the coil board, in a layered manner;
    wherein the first and the second receiver coil in the layered arrangement are each formed with three layers;
    wherein the transmitter coil is arranged between the first and the second receiver coil; and
    wherein the transmitter coil includes multiple layers.

11. The inductive proximity switch according to claim 10, wherein a number of the multiple layers is in a range of two to five.

12. The inductive proximity switch according to claim 10, wherein the first receiver coil and the second receiver coil have opposite winding directions.

13. The inductive proximity switch according to claim 1, wherein a coil stack of the coil board has eight to sixteen layers, optionally eight to fourteen layers, further optionally fourteen layers.

14. The inductive proximity switch according to claim 1, wherein the housing is made at least partially from metal.

15. The inductive proximity switch according to claim 14, wherein, in an installed state, the coil system is at least partially surrounded by metal in a circumferential direction.

16. A method for producing a coil system for an inductive proximity switch, comprising:
    producing a coil system by:
        forming at least one first receiver coil on a coil board in a layered arrangement; and
        forming a transmitter coil on the first receiver coil in a layered arrangement;
        wherein the first receiver coil includes a coil with a polygonal form; and
    arranging the coil system in a housing in a flush or non-flush manner;
    wherein the housing has a square housing cross-sectional area suitable for receiving the coil system; and
    wherein the first receiver coil is arranged such that it is rotated through 45° with respect to the square housing cross-sectional area.

17. The method according to claim 16, wherein the transmitter coil comprises a coil having a circular form.

* * * * *